(12) United States Patent
Kostro et al.

(10) Patent No.: US 9,695,629 B2
(45) Date of Patent: Jul. 4, 2017

(54) GLAZING WITH EMBEDDED MICROSTRUCTURES FOR DAYLIGHTING AND SEASONAL THERMAL CONTROL

(71) Applicant: ECOLE POLYTECHNIQUE FEDERALE DE LAUSANNE (EPFL), Lausanne (CH)

(72) Inventors: André Kostro, Lausanne (CH); Andreas Schüler, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 12 days.

(21) Appl. No.: 14/420,163

(22) PCT Filed: Aug. 7, 2013

(86) PCT No.: PCT/IB2013/056459
§ 371 (c)(1),
(2) Date: Feb. 6, 2015

(87) PCT Pub. No.: WO2014/024146
PCT Pub. Date: Feb. 13, 2014

(65) Prior Publication Data
US 2015/0225994 A1 Aug. 13, 2015

(30) Foreign Application Priority Data

Aug. 7, 2012 (EP) ..................... 12179596

(51) Int. Cl.
*G02B 5/08* (2006.01)
*G02B 7/182* (2006.01)
(Continued)

(52) U.S. Cl.
CPC .............. *E06B 3/6722* (2013.01); *E06B 9/24* (2013.01); *F21S 11/007* (2013.01); *F24J 2/0015* (2013.01);
(Continued)

(58) Field of Classification Search
CPC .. E06B 3/6722; E06B 9/24; E06B 2009/2417; H01L 31/0547; F21S 11/007;
(Continued)

(56) References Cited

U.S. PATENT DOCUMENTS

| 4,143,640 A * | 3/1979 | Pierce | F24J 2/0433 126/600 |
| 5,220,462 A * | 6/1993 | Feldman, Jr. | F24J 2/085 126/684 |

(Continued)

FOREIGN PATENT DOCUMENTS

| CH | WO 2012175555 A1 * | 12/2012 | ........... E06B 3/6722 |
| DE | 3132534 A1 * | 3/1983 | ............. A01G 9/222 |

(Continued)

OTHER PUBLICATIONS

First Office Action issued Dec. 23, 2015 in Chinese Patent Application No. 2013800418603 (8 pages) with an English Translation (12 pages).
(Continued)

*Primary Examiner* — Bumsuk Won
*Assistant Examiner* — Collin X Beatty
(74) *Attorney, Agent, or Firm* — Drinker Biddle & Reath LLP

(57) ABSTRACT

A glazing for daylighting and seasonal thermal control, the glazing including a pane defined between an outside-oriented interface and an inside-oriented interface, the pane comprising a first component and a second component,
(Continued)

wherein the first component has a parabolic reflective surface with a focus point located on the second component.

17 Claims, 6 Drawing Sheets

(51) Int. Cl.
| | | |
|---|---|---|
| *G02B 5/10* | (2006.01) | |
| *E06B 3/67* | (2006.01) | |
| *H01L 31/054* | (2014.01) | |
| *F21S 11/00* | (2006.01) | |
| *F24J 2/00* | (2014.01) | |
| *G02B 19/00* | (2006.01) | |
| *E06B 9/24* | (2006.01) | |
| *F24J 2/14* | (2006.01) | |
| *F24J 2/48* | (2006.01) | |
| *F24J 2/50* | (2006.01) | |

(52) U.S. Cl.
CPC ..... *G02B 19/0028* (2013.01); *G02B 19/0042* (2013.01); *H01L 31/0547* (2014.12); *E06B 2009/2417* (2013.01); *F24J 2/14* (2013.01); *F24J 2/48* (2013.01); *F24J 2/50* (2013.01); *Y02E 10/52* (2013.01)

(58) Field of Classification Search
CPC ...... F24J 2/0015; F24J 2/14; F24J 2/48; F24J 2/50; G02B 19/0028; G02B 19/0042; Y02E 10/52
USPC ........ 136/246, 259, 244, 251, 252; 359/350, 359/361, 595, 597, 614, 853, 850, 851, 359/857
See application file for complete search history.

(56) References Cited

U.S. PATENT DOCUMENTS

| | | | | |
|---|---|---|---|---|
| 5,880,886 | A * | 3/1999 | Milner | E06B 9/24 359/592 |
| 6,239,910 | B1 * | 5/2001 | Digert | E06B 9/28 160/104 |
| 7,439,600 | B2 * | 10/2008 | De Ruiter | H01L 31/077 257/443 |
| 8,462,437 | B2 * | 6/2013 | Thuot | E06B 7/082 359/595 |
| 8,837,049 | B2 * | 9/2014 | Tandler | G02B 17/006 160/187 |
| 2003/0112518 | A1 * | 6/2003 | Rogers | E06B 9/28 359/596 |
| 2010/0101565 | A1 * | 4/2010 | Maxson | E04F 10/08 126/702 |
| 2010/0132793 | A1 * | 6/2010 | Nakamua | H01L 31/048 136/259 |
| 2013/0025799 | A1 * | 1/2013 | Pellini | E06B 9/386 160/107 |
| 2013/0265642 | A1 * | 10/2013 | Vasylyev | G02B 19/0042 359/595 |
| 2014/0196395 | A1 * | 7/2014 | Mathez | E06B 3/6722 52/406.1 |

FOREIGN PATENT DOCUMENTS

| | | | | |
|---|---|---|---|---|
| DE | 39 27 947 A1 | 2/1991 | | |
| NO | WO 2010086720 A1 * | 8/2010 | ............ | E06B 9/264 |
| WO | WO-2009/002350 A1 | 12/2008 | | |
| WO | WO-2010/086720 A1 | 8/2010 | | |

OTHER PUBLICATIONS

Second Office Action issued Sep. 27, 2016 in Chinese Patent Application No. 2013800418603 (5 pages) with an English Translation (6 pages).

* cited by examiner

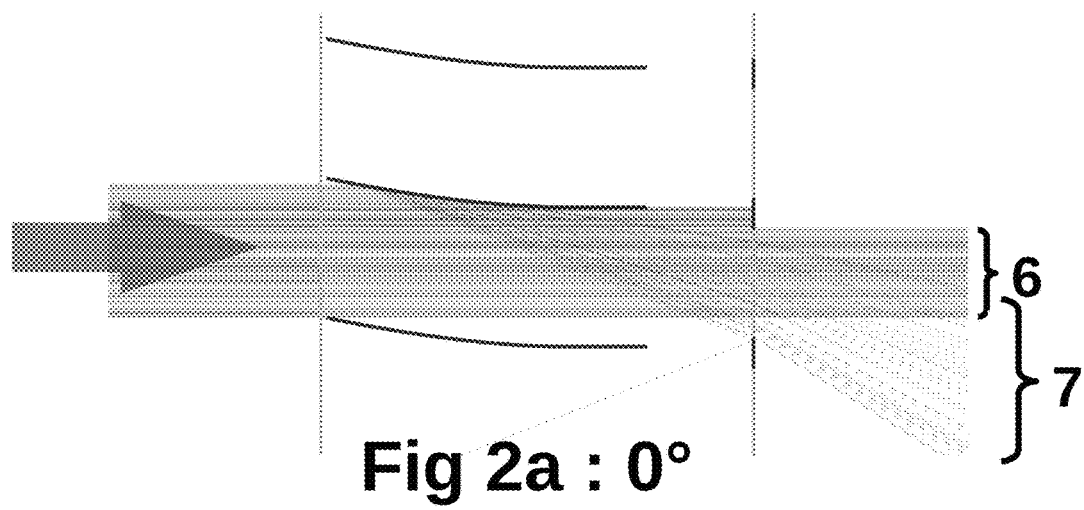
Fig 2a : 0°
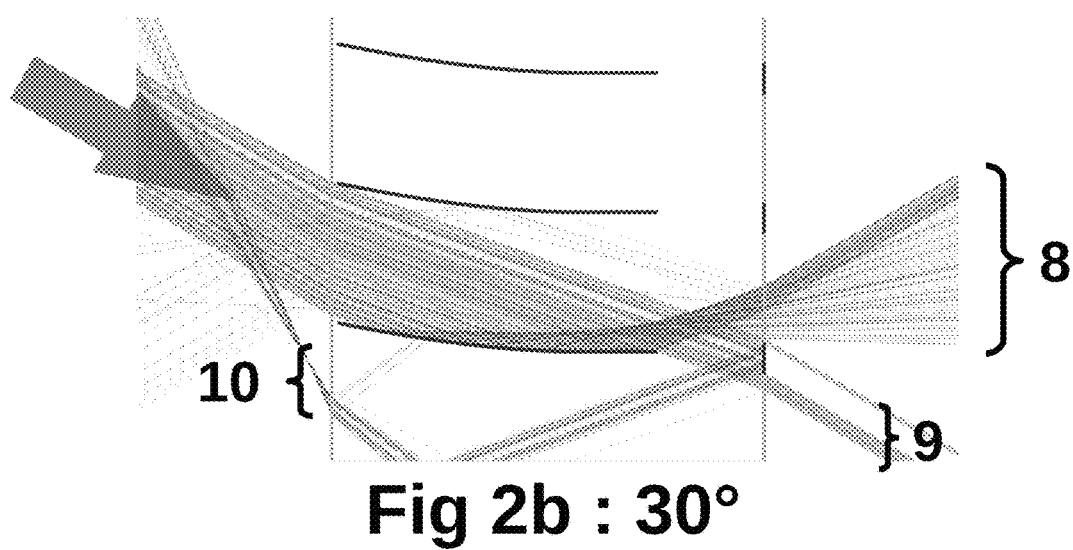
Fig 2b : 30°
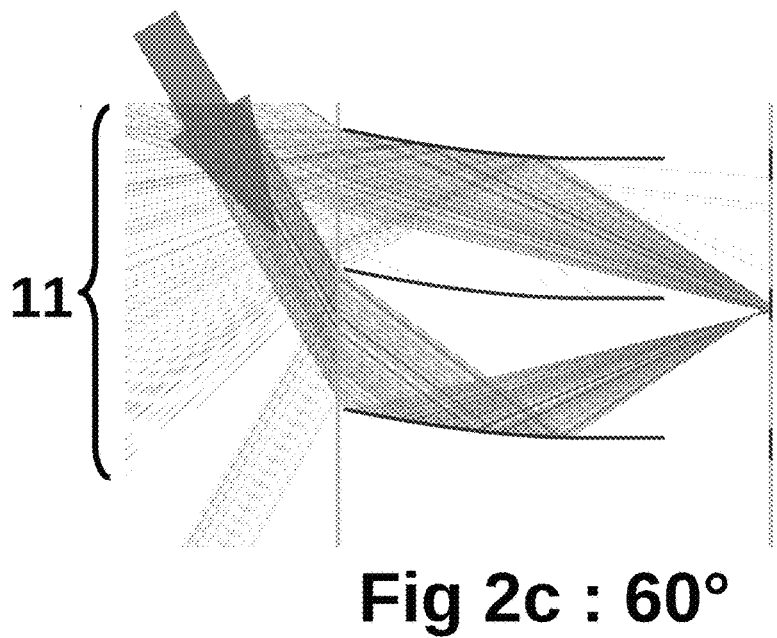
Fig 2c : 60°

GLAZING WITH EMBEDDED MICROSTRUCTURES FOR DAYLIGHTING AND SEASONAL THERMAL CONTROL

CROSS REFERENCE TO RELATED APPLICATIONS

This application is a §371 National Stage Application of PCT International Application No. PCT/IB2013/056459, filed Aug. 7, 2013, and claims priority under 35 U.S.C. §119 and/or §365 to European Application No. 12179596.7 filed Aug. 7, 2012.

FIELD OF THE INVENTION

The invention relates to microstructured glazing for daylighting and thermal control.

STATE OF THE ART

Various designs use different prismatic structures to create angular dependent transmittance. The oldest might be the one described in the 1980 French patent number 8017364, publication number 2463254. The entry surface is flat and the exit surface is made of prisms. Using this design the electromagnetic radiation incoming on the device close to the normal hits the exit surface at a high angle. Because of the difference in refraction indexes, total internal reflection occurs. Symmetry in the prism guarantees that electromagnetic radiation from this angular interval is then reflected back out of the system. Such devices transmit electromagnetic radiation only outside this angular interval. For fenestration applications, the main drawback of this design is that the panels are not transparent because of the prismatic structures. They distort the image and can not be seen through. Also the overall transmittance is not very high, distributed symmetrically and the direct solar beam is transmitted as a bright parallel beam and is not diffused.

Another device was described by Edmonds I. R. In "Performances of laser cut light deflecting panels in daylighting applications" in Solar Energy Materials and Solar Cells 29 in 1993. It uses total internal reflection to reflect light above a certain angle. Instead of embedding mirrors, thin horizontal cuts in an acrylic panel create and interface with air. Light hitting this interface above the critical angle is reflected. This device protects from glare and redirects light into the depth of the room. For better redirection, the cuts can be tilted. The main drawbacks of this design are that it only redirects light and that because of the thickness of the cuts, transparency is limited.

Lorenz W. disclosed in patent documents EP 1 072 752 A1 and EP 0 823 645 B1 a system for solar protection, daylighting and energy saving with a clear view. This design uses two complementary asymmetric 90° prismatic structures to preserve translucency. It relies on mirrors deposited on the small face of the prism to redirect light for daylighting. Total internal reflection is used to introduce angular dependent transmittance. Above a certain angle, the air pocket between the two prismatic panels induces a total internal reflection that blocks a selected range of angles. The main drawback of this is that it requires relatively large components and complicated assembly to preserve a parallel air pocket between the two components.

Koster H. proposed in German patent application DE 10 2009 056 362 A1 novel types of blinds which have a complex profile combining a W shaped part and a parabolic part. The third and fifth faces of the W block direct sunlight whereas the parabolic part redirects it. The blocking effect of the W is increased for higher angles of incidence (50°-90°) as the projected surface of the two faces increases. For more horizontal angles (30°-50°), the parabolic surface is dominant and light is mostly redirected. Finally for horizontal angles, the projected height of the relatively flat profile of the blinds represents only about 25% of the period. This provides good translucency. This design provide both redirection and angular dependent transmittance but the complex profile increases the fabrication cost of such blinds and to be protected from wind and dust such blinds should ideally be placed inside a double glazing. This crates very thick and expensive windows. Finally mechanical parts are subject to be damaged and prevent the system from working.

At the Fraunhofer institute, prismatic structures use refraction and total internal reflection to change the transmission depending on the incoming angle. They proposed a new geometry, reduced sizes and combined the geometry with coatings. The drawbacks are the same as with all prismatic structure mentioned above.

S. Klammt and A. Neyer propose an asymmetric microstructure for daylighting only. This structure uses a succession of quarters of a circle on the first face to capture a maximum of light even for high angles of incidence. The horizontal part at the bottom of the quarter of circle reflects light on the basis of total internal reflection. This lenses also redistributes a parallel beam aver a range of angles. On the inner side, the tilted surface of prismatic structures bend the light in a more horizontal direction and the horizontal flat surface further increase the proportion of light redirected upward by total internal reflection. This design is very efficient at redirecting large portion of incoming light from all angles along a horizontal direction. This structure achieves neither a seasonal or angular dependent effect nor transparency.

Various types of thin film coatings exist to select the transmitted spectrum. They can be used to create glazing with high transmittance in the visible range of the spectrum but low transmittance in the ultraviolet and infrared range. Such coatings have a slight angular dependency but the variations are not significant for low angles and redirection is inexistent. Stronger angular dependence can be reached using angular deposition of metallic coatings as described by Smith G. B. and Al. in "Thin film angular selective glazing" in Solar Energy volume 62. Such depositions can create columnar structures under particular conditions. This structure creates an angular selectivity but it is very smooth and the variation of transmittance is very gradual. With a maximal transmittance of 70% at 60° for example, 10% transmittance is reached only at −60° in a very progressive way.

Koolshade and Koolglass are products that create an angular dependence using tiny blinds at a fixed angle. These blinds can be placed in a window or laminated between two windows. The blinds are black and block all radiation above 40°. They prevent glare and strongly reduce solar gains all over the year. The drawback is that solar gains in winter are also reduced. Transparency of such systems is acceptable but the transmitted light is not redirected.

B. Lamontagne et al at the National Research council, Ottawa in Canada proposed micro-blinds. These micro-blinds are electro-statically activated curling electrodes of 100 micrometers. The blinds can be closed and opened by applying an electrical current. Their results have been published in US patent application 2006/0196613 A1. This is a dynamic system that can be used to control transmitted light. It is similar to an electrochromic window.

More recently (A. Kostro; A. Schüller; J. L. Scartezzini "Towards microstructured glazing for daylighting and thermal control". CISBAT 2011 Proceedings, p 455-460) flat integrated mirrors for daylighting were mentioned.

Existing glazing structures, when used as windows in buildings, already offer some advantages. However none of them provides at the same time the following advantages:
 Reduced overheating in summer
 Reduced heating costs in winter
 Good light levels several meters from the window and without glare for occupants
 Good translucency and view towards the outside

GENERAL DESCRIPTION OF THE INVENTION

The problems mentioned in the previous chapter are solved with the present invention which relates to a glazing as defined in claim 1, namely a glazing for daylighting and seasonal thermal control, said glazing being essentially made of a pane defined between an outside-oriented interface and an inside-oriented interface, said pane comprising a first component and a second component, wherein said first component has a parabolic reflective surface with a focus point located on said second component.

The glazing according to the present invention can advantageously be fabricated in a roll to roll or web process. The originality lays in the described two component structure, i.e. the first and second sets of reflective components. This concept can be applied both at macroscopic scale for blinds and at microscopic scale for clear vision and electromagnetic radiation redirecting glazing. Optional selective coatings can further functionalize this system and add a spectral behavior. This type of design can also be used for protruding shading components.

The glazing according to the invention may be adapted to specific locations, e.g. the latitude and/or the window orientation with respect to the sun path.

The glazing may induce strong variation of transmission (respectively reflection). Such variation is related to the electromagnetic radiation incoming angle.

In the present document the term "incoming angle ($\phi$)" has to be understood as the angle defined between the incoming electromagnetic radiation direction and the normal to the plane defined by the outside-oriented interface.

The "outside-oriented" and "inside-oriented" interfaces are preferably air-glass interfaces. But any other suitable interface may be considered, for instance glass-glass or gas-glass.

In a preferred embodiment of the invention, for an application at latitudes around 45°, the components are arranged in a manner as to define three different electromagnetic radiation paths, each of them depending on the incoming angle:
 Path 1—low incoming angles, typically between 0° and 20°
 Path 2—medium incoming angles, typically between 20° and 50°
 Path 3—high incoming angles, typically between 50° and 70°
 Path 4—very high incoming angles, typically above 70°

Practically, direct sunlight with medium incoming angles occurs in winter while high incoming angles occur only in summer. Very high angles occur only for diffuse light.

When the incoming angle is between 0° and 20° most of the electromagnetic radiation is directly transmitted through the glazing.

When the incoming angle is between 20° and 50° an increasing part of the electromagnetic radiation is redirected and transmitted in a diffuse way.

When the incoming angle is between 50° and 70° most of the electromagnetic radiation is redirected and reflected back to the outside or absorbed.

When the incoming angle is above 70° almost all the transmitted electromagnetic radiation is redirected and the proportion reflected at the first interface increases.

The invention provides several advantages, in particular:
 By redirecting electromagnetic radiation, a direct beam can be diffused and spread over a selected range of angles in an opposite direction. This is particularly suitable for a better use of daylight in buildings. Redirected, diffuse electromagnetic radiation is well suited for most office work tasks and contribute to a more comfortable and healthy environment.
 Because the solar elevation changes over the year, angular dependent transmittance can result in a seasonal behavior. Used in a window with the appropriate angular transmittance, the invention protects from overheating in summer and keeps high solar gains in winter. In summer the direct radiation from the sun is reflected back by the combined action of two mirrors.
 The structures are periodic and their projected height is very small compared to the periodicity. Because they are embedded, for angles close to the normal the path of electromagnetic radiation is only partly influenced by the structures and traverses only the transparent medium. The faces of this medium are flat and parallel, thus at normal incidence, the system is imaging and transmission is mainly direct. Transparency is high.
 The system can be produced as embedded micro-structures in a film with a total thickness bellow the millimeter. A film of this dimension can be laminated with the glass of a window. Such films can be produced inexpensively in a roll to roll or web process. The height of individual structures may be less than 50 µm and hardly visible by the human eye.
 The second surface may be coated with a selective coating to obtain spectral transmission for the chosen angles only. For example to transmit an optimized ratio of visible electromagnetic radiation and energy.
 With a high concentration rate on the second surface, this surface can also be used to absorb energy and transform it thermally or electrically.
 More generally, the surfaces can be of any kind that is suitable to manipulate electromagnetic radiation. They may be thermo-chromic, gazo-chromic, polarizing, electrochromic, selective, absorbing, reflecting etc.
 The first component can have different properties on its surfaces. The top side may be highly reflective for redirection of electromagnetic radiation while the back side might be diffusing or absorbing to reduce ghost images.
 The film can be combined with a low emissivity coating to provide a complete solution for glass makers to laminate with their windows.

BRIEF DESCRIPTION OF THE DRAWINGS

FIG. 2a is a diagram of a pane showing transmission of electromagnetic radiation incoming with normal incidence;

FIG. 2b is a diagram of a pane showing transmission of electromagnetic radiation incoming at 30°;

FIG. 2c is a diagram of a pane showing transmission of electromagnetic radiation incoming at 60°;

DETAILED DESCRIPTION OF THE INVENTION

The invention will be better understood in this chapter which, in particular, contains some examples.

Figure 1A:
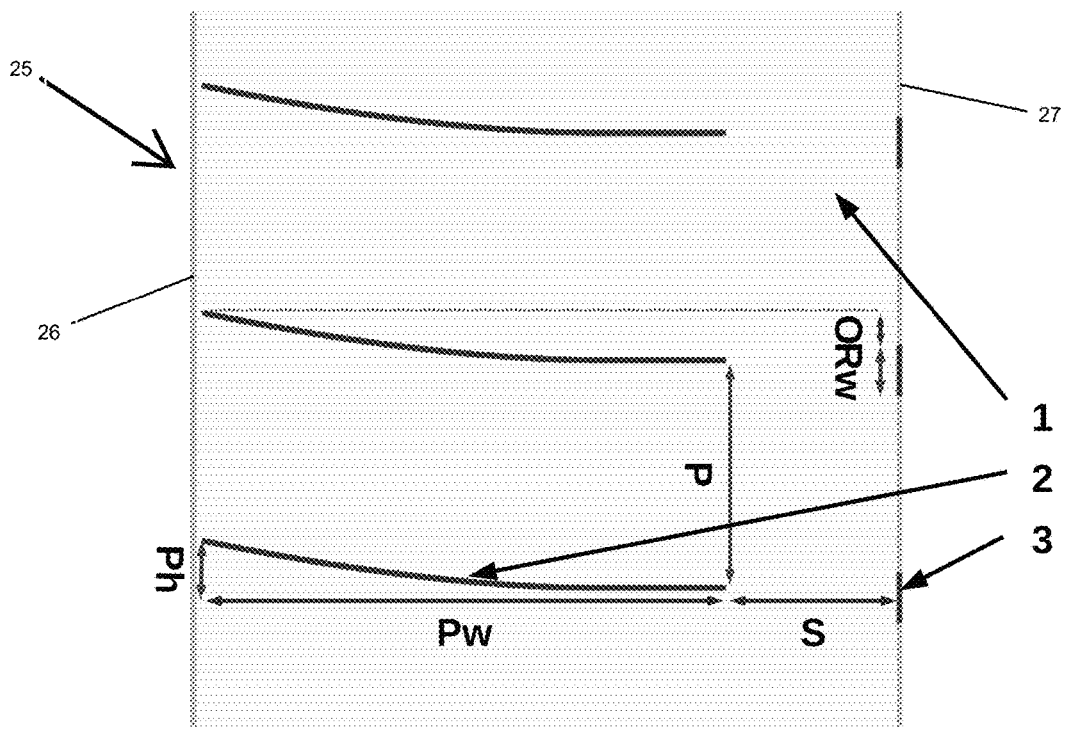
FIGS. 1a and 1b are diagrams showing an embodiment of a pane.

A first example of the invention is shown FIG. 1a. A pane 25 defined between an outside-oriented interface 26 and an inside-oriented interface 27 contains first and second components 2,3. Each component 2 of the first set has a parabolic surface with a focus point F located on a second component 3. The first components 2 are embedded in a transparent medium 1 and the second components are arranged at the inside-oriented interface 27. For a selected range of incoming angles, usually between 50° and 70°, each first component 2 concentrates the electromagnetic radiation on a second component 3. For other angles, i.e. lower angles, the second component 3 is out of focus. The components can have different optical functions depending on the goal: reflectors, absorbers, diffusers, polarizers, selective coatings or thermo-chromic.

Three situations corresponding to incoming angles of 0°, 30° and 60° are presented in FIGS. 2a, 2b and 2c. Electromagnetic radiation transmitted through the system without hitting any of the two components will be referred to as direct transmitted electromagnetic radiation. Electromagnetic radiation reflected by the parabola but passing by the second component will be referred to as redirected electromagnetic radiation. Finally electromagnetic radiation focused onto the second component will be referred to as selected electromagnetic radiation.

To focus incoming electromagnetic radiation, the first component 2 is provided with a parabolic surface. An incoming angle (φ) for which electromagnetic radiation will be most efficiently focused on the second component 3 has to be chosen according to the desired application of the system. The refraction at the first interface has to be accounted for to calculate the tilt angle of the parabola:

$$\theta = a\sin(\sin(\phi)/n_r)$$

Where $n_r$ is the refraction index of the material 1 the parabola is embedded in. The focal point F is placed on the backside of the system and the parabola drawn accordingly. Electromagnetic radiation incoming at the chosen elevation φ 4 will be reflected towards the focal point by the embedded reflector.

The ratio between the width Pw and height Ph of the first component and its periodicity P will determine the range of angles for which the parabola redirects electromagnetic radiation. Depending on this ratio the shading angle $\theta_s$ can be defined:

$$\sin(\theta_s) = n_r \cos(a\tan(Pw/(P+Ph))$$

Above this angle, 100% of electromagnetic radiation transmitted by the first interface will hit the parabola. Bellow this angle, the portion of electromagnetic radiation hitting the parabola gradually declines.

After reflection on a parabolic shape a parallel beam is distributed over a range of angles 8. The curvature of the parabolic reflector accounts for the magnitude of this distribution. The curvature is linked with the distance between the parabola and the focal point F. The closer the point is, the stronger is the curvature. This distance is defined by the vertical distance S and the offset O.

The upper surface of this parabola, on the convex side is typically reflective to achieve focus. The type of reflective coating may be modified and have a specific spectral reflectance. The other surface, on the concave side may be reflective, diffusing or absorbing depending on the goals.

The second component 3 may have different functionalities depending on the application, it is preferably located on the back surface of the system and electromagnetic radiation focused here by the parabolic surface can be reflected, absorbed or selectively transmitted.

In any case, the second component 3 should be located close to the foci F of a first component 2, on the rear surface of the device. Its width Rw directly influences the range of angles for which the system is designed. Electromagnetic radiation incoming with angles bellow φ will hit the interface bellow the focal point. For angles close to φ, the electromagnetic radiation will remain somewhat focused when it hits this interface.

Figure 1B:
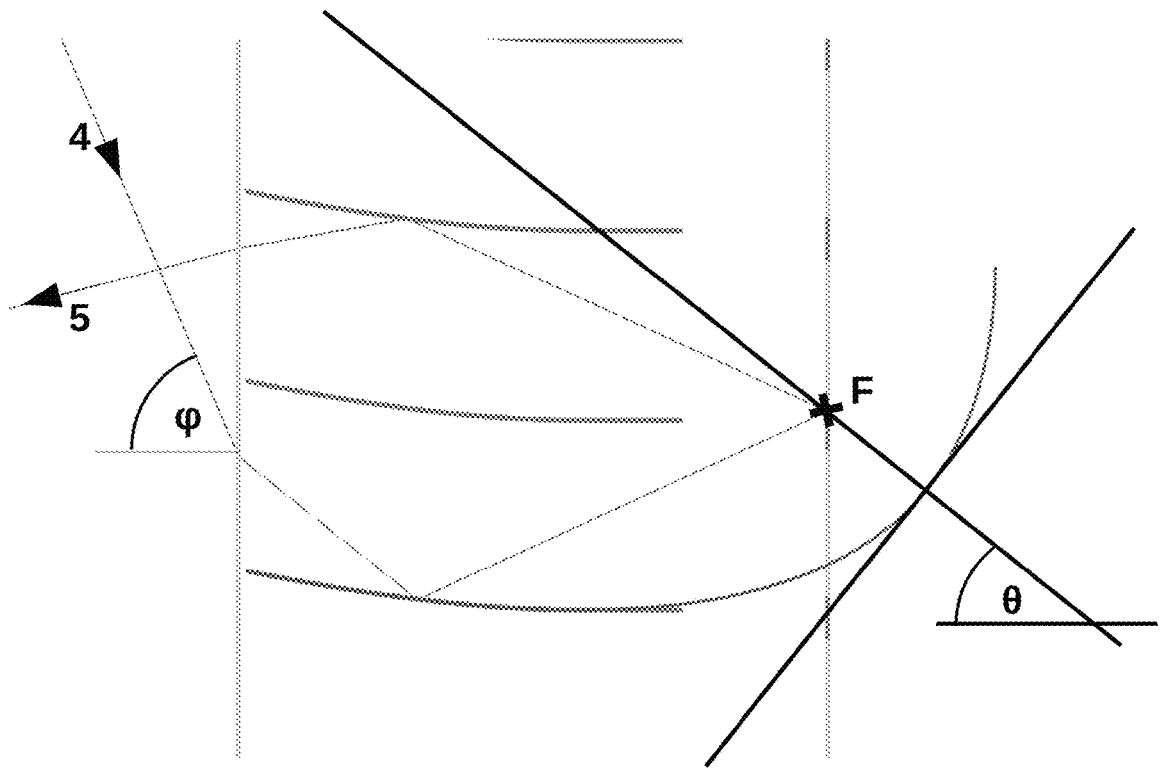

This component can be a reflector, and redirect electromagnetic radiation back through the system. This case is illustrated in FIGS. 1 and 2. In this case, the selected electromagnetic radiation is blocked and prevented from being transmitted by redirecting it towards the exit of the system 5.

It can be a thin film coating applied in this area to transmit only selected parts of the spectrum. For example visible electromagnetic radiation in the 380-780 nm range can be mostly transmitted but electromagnetic radiation from the ultraviolet and infrared range mostly reflected to reduce energetic transmittance.

Finally it can be some type of absorber to convert the radiation to thermal or electrical energy.

Advantageously parameters should be chosen in a way to avoid multiple reflections. The path of the majority of blocked rays should have at most three reflections. This reduces the absorption in the system and therefore reduces overheating risks.

FIG. 2 illustrates the path of electromagnetic radiation for different situations; in this example the second component 3 is a reflective coating. The path of electromagnetic radiation is shown for all possible positions of a single block.

As shown in FIG. 2a, this device has little influence on electromagnetic radiation incoming with normal incidence. Most of it is transmitted directly 6, interacting only with the front and rear interfaces of the design. The parallel arrangement and smooth surface of these interfaces preserve the view through the system. A small part is redirect by the lower surface of the embedded surface 7. The physical properties of this surface determine the way electromagnetic radiation is distributed. It may be secularly reflected as in the illustrated case, diffused or absorbed. A minor part of electromagnetic radiation interacts with the second component.

FIG. 2b illustrates the redistribution of a beam impinging at 30°. Most of it is redirected and transmitted in a mostly diffuse way 8. The redirection is in the opposed direction relative to the horizon and can be modified by tilting the whole parabola. A minor part of electromagnetic radiation is transmitted directly 9, this fraction can be reduced or increased by changing the ratio between width and periodicity of the parabola. A small fraction also hits the second component. In the illustrated case, this component is a reflector and this fraction is prevented from being transmitted 10.

Finally for angles within the selected range, all the electromagnetic radiation is focused by the embedded parabola onto the rear component. In the case illustrated in FIG. 2c, electromagnetic radiation is blocked 11 after two or three reflections. With the rear component starting at the focal point as illustrated, the blocking range ends at φ and can be more or less broad depending on the width Rw of the second component.

Seasonal Thermal Control, Daylighting and Clear View

In the following example the invention is used to create a complex fenestration system combining seasonal thermal control, daylighting and clear view.

Figure 3B:
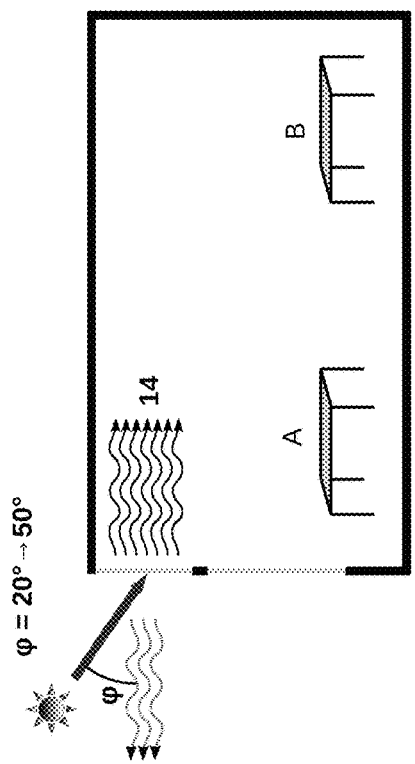
FIGS. 3a-3c are diagrams showing a fenestration system.
Figure 3A:
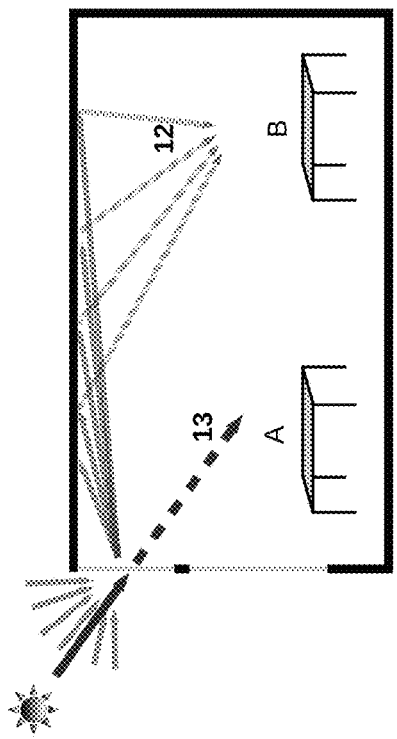
Figure 3C:
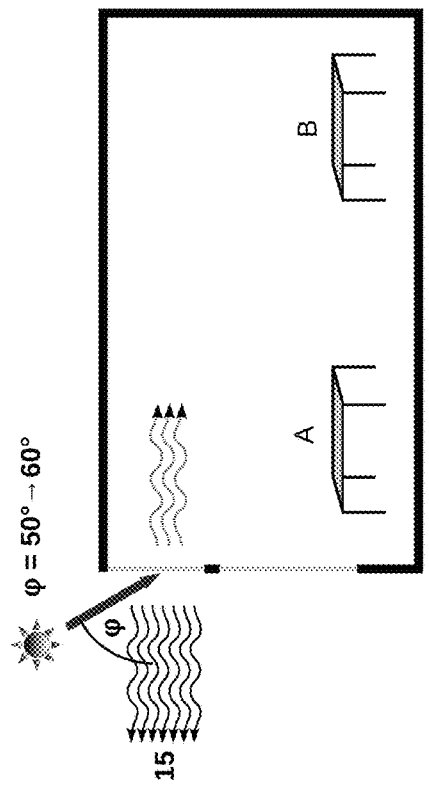

The objective is to bring in a maximum of light without creating glare and to have maximal thermal gains in winter and minimal gains in summer. The principles for a complex fenestration system combining seasonal thermal control, daylighting and clear view are introduced in FIGS. 3a, 3b and 3c.

By the means of transmitted radiation, windows bring light and heat into buildings. Light is required to perform everyday activities but can also be disturbing when it creates glare. Glare is often created by direct sunlight close to the windows A. Light levels are often to low further away from the window B. Because it redirects light, the invention can be used to transmit light in a manner suitable for daylighting by redirecting it further into the room 12 without creating glare 13.

The transmitted radiation also transport heat, additional heat is welcome in winter but should be kept outside in summer. Taking advantage of the angular dependence of transmittance and the changing elevation of the sun depending on the seasons, the proposed design maximizes winter gains 14 whereas it minimizes summer gains 15.

In this case, the first component is highly reflective on the top surface and can be diffusing on the bottom surface to avoid glare. The second component is a reflective surface or eventually a selective coating that transmits mostly visible electromagnetic radiation while it reflects infrared radiation to reduce solar gains.

The focus is achieved for angles corresponding to the summer elevation of the sun at the specified location (for example between 55° and 67° in Lausanne). For this range the electromagnetic radiation is concentrated on the second surface and reflected back through the system. To achieve this range of angles, the parabola is designed with φ=67°.

Since the focus effect should be achieved for angles corresponding to the summer sun elevation and not for lower, winter elevations; the region of the surface useful for focusing does not include the part of the parabola towards the inside of the glazing. This surface can be left flat or tilted and serve only for daylighting.

For angles out of the selected blocking interval, the first component of the system reflects electromagnetic radiation in an upward direction but with a low angle to achieve maximum penetration in the depth of the room. A parallel beam is effectively diffused by the curvature of the parabola. This diffusion is enhanced by the refraction at the rear interface were the angular difference is increased. Such a diffused electromagnetic radiation is suitable for daylighting.

To achieve clear view, direct transmission without interaction for close to normal angles is maximized. The two components have a minimal height and maximum overlap. Also, the first and last interfaces are parallel to avoid distorting the image.

Compared to conventional windows, blinds or complex fenestration systems this design has several advantages:

It achieves simultaneous angular dependent transmittance and redirection of electromagnetic radiation.

Because of the small dimension (sub-millimeter), the structures are almost invisible and the resulting system is close to transparent.

Redirected electromagnetic radiation is distributed horizontally in a diffuse way, hereby suitable for daylighting.

The system is thin and can be fabricated in a roll to roll process or web process and be produced as a foil. This foil can easily be placed inside standard double glazing.

Unlike external blinds or shades, the system is static and protected therefore not sensible to strong winds.

It can be placed on the first glass of a double glazing. This reduces unwanted thermal gains in the cooling period.

Because it can be part of the glazing, integration is easy.

Cost in the case of roll to roll production is low.

There are no mobile parts therefore more robustness.

The optimal structure dimension was found by Monte Carlo ray tracing simulations. The software was developed in house and especially designed to rapidly model laminar structures and give visual feedback to the user. The performances of different designs were calculated and parameters were optimized.

Ray tracing is a technique from geometrical optics to model the path taken by electromagnetic radiation in an environment by following rays of electromagnetic radiation. It may be use in the design of optical devices such as lenses and sets of lenses in microscopes, telescopes etc. There is a lot of existing ray tracing rendering software, more or less physically accurate, to simulate the behavior of electromagnetic radiation in complex environment. The developed software aimed at the engineering of complex fenestration systems with two dimensional profiles and window specific performance analysis.

Monte Carlo algorithms are stochastic and they are used to solve complex physical or mathematical problems. When the number of variables in a system is great and the solution can not be found analytically, computing the outcome using many random events gives an accurate estimate of the solution. In a typical Monte Carlo algorithm, random draws define a chain of local events characterizing the global event and leading to a final state. Each draw follows a given distribution representative of the corresponding event. By repeating this iteration over random events numerous times, a probability distribution of the final states is obtained. The accuracy of this solution depends on how well the problem is modeled and how many draws are made. In the case of optical systems, every event (reflection, refraction, scattering, absorption) occurs randomly according to the probability distribution dictated by the corresponding physical laws. These laws were accurately implemented for the ray tracing of complex fenestration systems.

A two dimensional (2D) description of the designs is sufficient for most existing CFS products because they can be described as 2D extruded profiles. An original algorithm using a mixed dimensionality approach was introduced to study such profiles. In the proposed algorithm, all intersections are computed in 2D. If a profile is defined in the x and y coordinates, the only loss of information is the z coordinate of the intersection. This information is of little use since we are interested mostly in the angular distribution of the transmittance. Finding intersections between lines in two dimensions is very fast and can be efficiently done using a binary space partitioning tree. For interactions however, all three dimensions are used. Reflection, refraction and absorption are precisely modeled using tree dimensional vector calculus and following physical rules as described in the following sections. Also, for the modeling of thin films, 3D vectors are used in combination with a matrix approach for the calculation of reflection, refraction and absorptions.

Figure 4A:
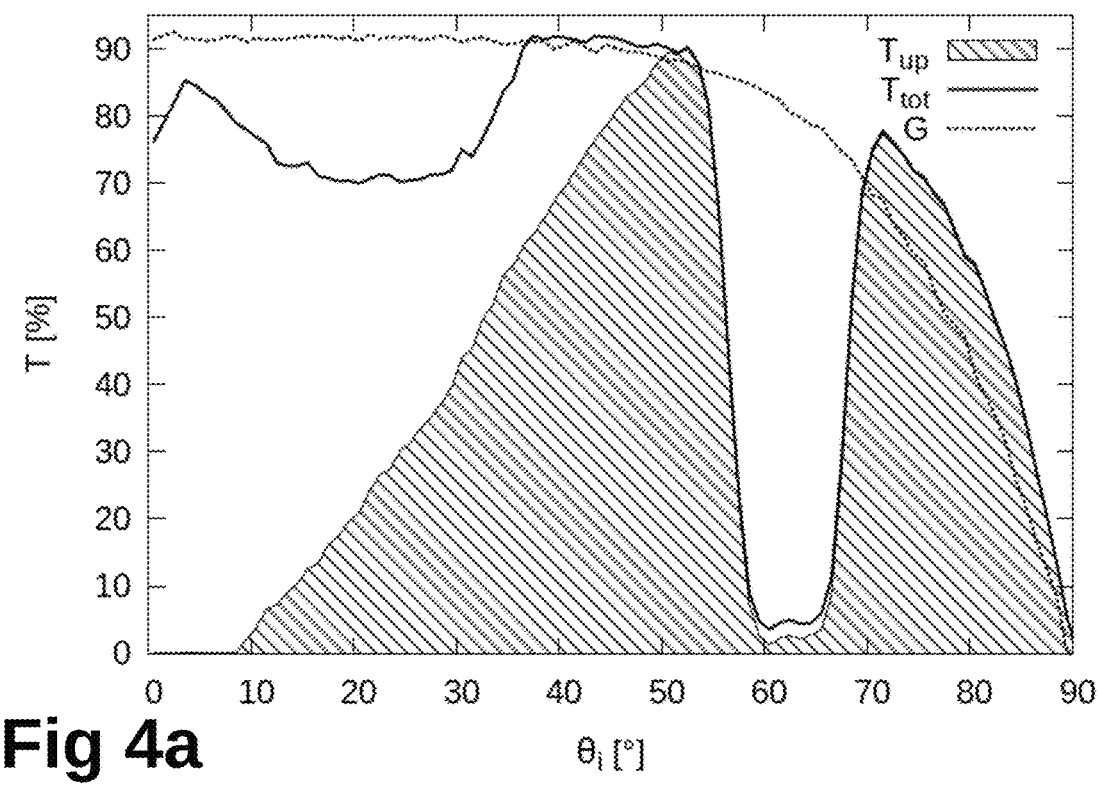
FIG. 4a is a chart showing percentage of electromagnetic radiation transmittance based on incoming angle.

To develop the structure with changing seasonal transmittance relying on the changing solar elevation, it is straight forward to look at the transmittance depending on the incoming angle. Additionally, to get an estimate of the daylighting performances, this transmittance can be subdivided depending on the outgoing elevation angle. Electromagnetic radiation hitting a window from the top half of the hemisphere should normally be transmitted in bottom half of the hemisphere facing the inner side of the window (hereafter $T_{down}$). In complex fenestration systems, redirection can make electromagnetic radiation exit in the upper half of this hemisphere (hereafter $T_{up}$). $T_{up}$ is contributing to daylighting more significantly than $T_{down}$ and should be maximized. For the analysis of CFSs with both seasonal thermal control and daylighting, the software computes $T_{down}$ and $T_{up}$ and the total transmittance depending on the incoming angle. $T_{up}$ and $T_{total}$ are shown in FIG. 4a for the structure illustrated in FIGS. 1 and 2 and compared to the total transmittance of a simple glass (G).

Figure 4B:
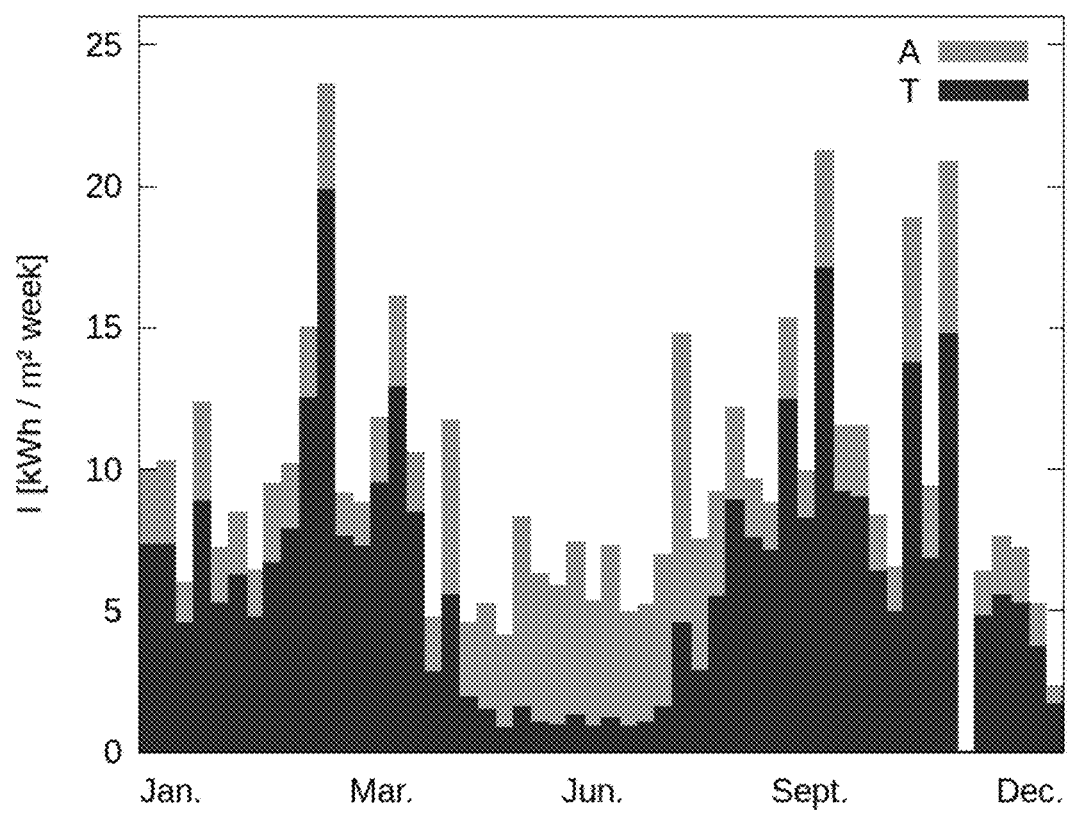
FIG. 4b is a chart showing weekly values of incident radiation and transmitted radiation.

To assess seasonal thermal control the dynamics of thermal gains are studied. They should be maximized in winter and minimized in summer. For each square meter of window, a portion of the incoming radiation is transmitted and this energy heats up the space behind the window. To calculate an estimate of this value, diffuse and direct transmission factors are calculated with the ray tracing simulation tool used in combination with meteorological radiometric data. For direct radiation the solar position is used and for diffuse radiation, the hemisphere is divided into patches following Tregenza's subdivision of the sky. The climatic data gives hourly values of temperatures as well as global and direct illumination values, A Perez model uses the two illumination values to provide illuminance values for each and every point of the hemisphere. Using this model, hourly values for the 145 Tregenza zones are computed depending on the location, orientation of the window and window tilt, The annual thermal gains due to direct and diffuse radiation were then computed using this method. The designed glazing showed a transmittance of direct sunlight lower than 20% during the summer period and higher than 70% during the winter period. The incident radiation A and the transmitted radiation T are shown in weekly values in FIG. 4b.

Simulations were used to define the geometry of the system and the system was then prototyped using a 7 step process:
  mold fabrication with desired final shape
  negative mold fabrication
  coating of substrate with stripes of reflective material
  alignment of substrate and mold
  replication of the shape in a UV curable polymer onto the substrate
  coating of selected facets on the replicated structure
  embedding of structures with the same UV curable polymer.

To fabricate the structure, a metallic mold was cut by Electrical discharge machining. This technique is widely used in the watchmaking industry and allows to cut any conducting metal with an accuracy bellow 1 micrometer. The fabricated metallic mold has one surface with the shape of the embedded mirror.

A soft material is engraved with a given shape, then chemical coated with a conducting layer and replicated into nickel by electroplating. Hereby a metallic mold is obtained.

The metallic mold obtained previously is replicated in a silicone (PDMS) to obtain the "negative" of the shape. In the laboratory process, this mold also features some alignment guides for the correct placement of the structure on the substrate in later steps. Using this negative the shape originally cut into the metallic mold can later be reproduced.

For the deposition of the second mirror, a reflective material needs to be deposited in stripes on the substrate. For better durability, the layer is deposited on the side where the structures are made; it is then trapped and protected. To deposit such stripes two techniques are available. First, masking the substrate with a stencil and directly depositing the aluminum. Second, using photolithography: aluminum is deposited on the substrate, and then covered with a layer of photoresist. Photo resist is a resin that changes its properties when exposed to UV light, it either breaks down or hardens when exposed. The photoresist is exposed to UV light through a mask to create the desired stripes pattern. An etching process then removes the aluminum where it remains unprotected and leaves only stripes where it is protected by the hardened resist. The lithography can also be done using Lift-off technique, in this case, the substrate is first coated with photoresist then exposed to UV light to remove resist were the aluminum needs to be deposited. Aluminum is the evaporated everywhere and when the resist is removed the aluminum coating above it is "lifted off" and only stripes remain.

Figure 5A:
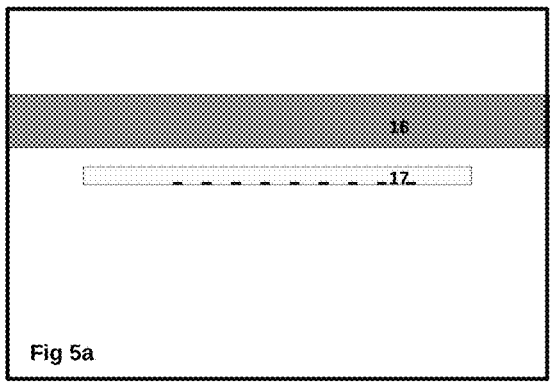
FIGS. 5a-5h are diagrams showing a method of manufacturing a pane.
Figure 5B:
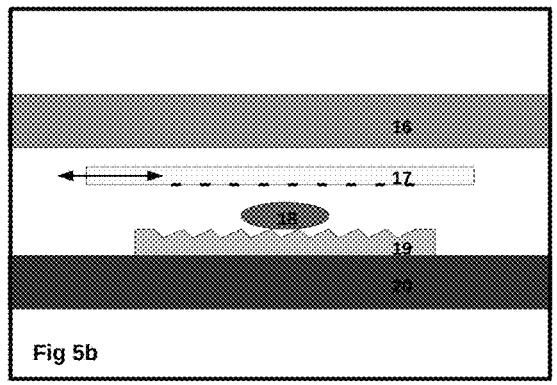

To obtain the desired system with angular dependent transmittance, it is crucial that the back reflector on the substrate 17 and the mold for replication 19 are correctly placed. This placement can be done under an optical microscope. It is illustrated in FIG. 5b.

Replication of the Shape in a UV Curable Polymer Onto the Substrate

Figure 5C:
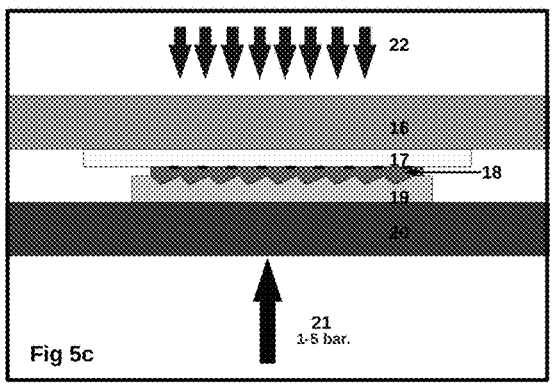
Figure 5D:
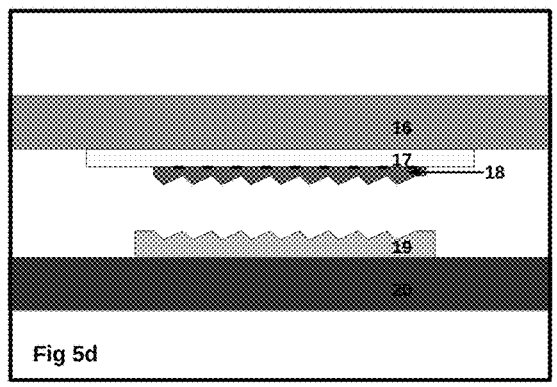

Once it is aligned with the stripes on the substrate, the negative mold is used to fabricate structures in an ultraviolet curable resin 18. As illustrated in FIG. 5b, a drop of resin is between the substrate and the mold 19. The mold is placed on a mechanical piston 20. A pressure 21 is then applied and the piston pushes the substrate against a Quartz window 16 as shown in FIG. 5c. After ultraviolet light 22 cured the resin, pressure is released and the microstructure is replicated onto the substrate (FIG. 5d). This process has been done in collaboration with the polymer and composite laboratory at EPFL (LTC). A transparent resin is used to replicate the structure. The resin hardens when exposed to ultraviolet light. Such processes are well adapted to roll to roll fabrication processes.

Figure 5E:
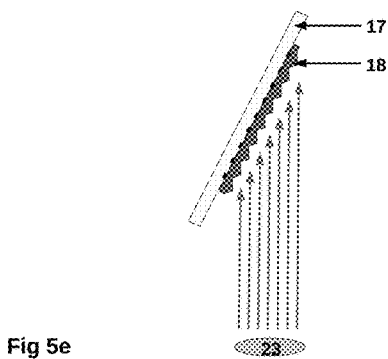

Once the structure was replicated, it is facet selectively coated by tilting the sample with the microstructure and depositing a thin reflective aluminum or silver film 23, FIG. 5e.

Figure 5F:
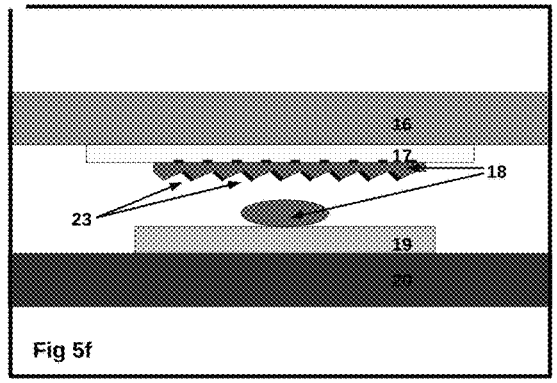
Figure 5G:
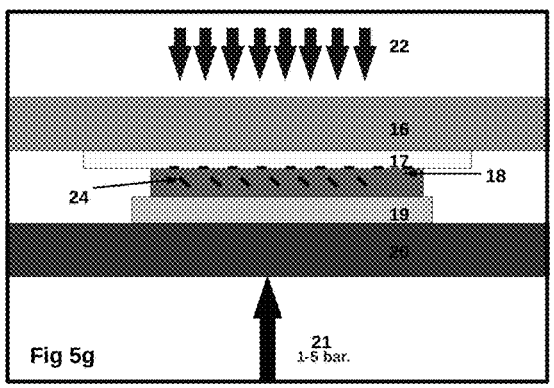
Figure 5H:
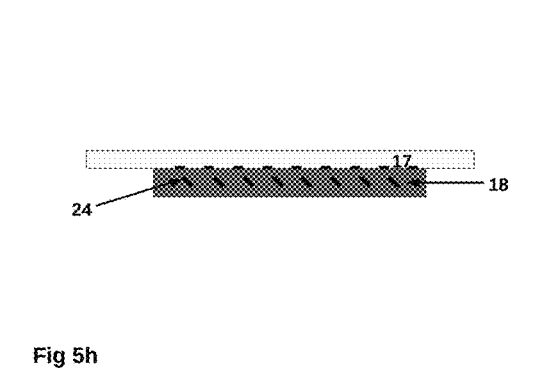

The same UV curing is then used to fill the gaps (FIGS. 5f, 5g and 5h). Care has to be taken to avoid bubble formation and to obtain appropriate index matching.

Figure 6:
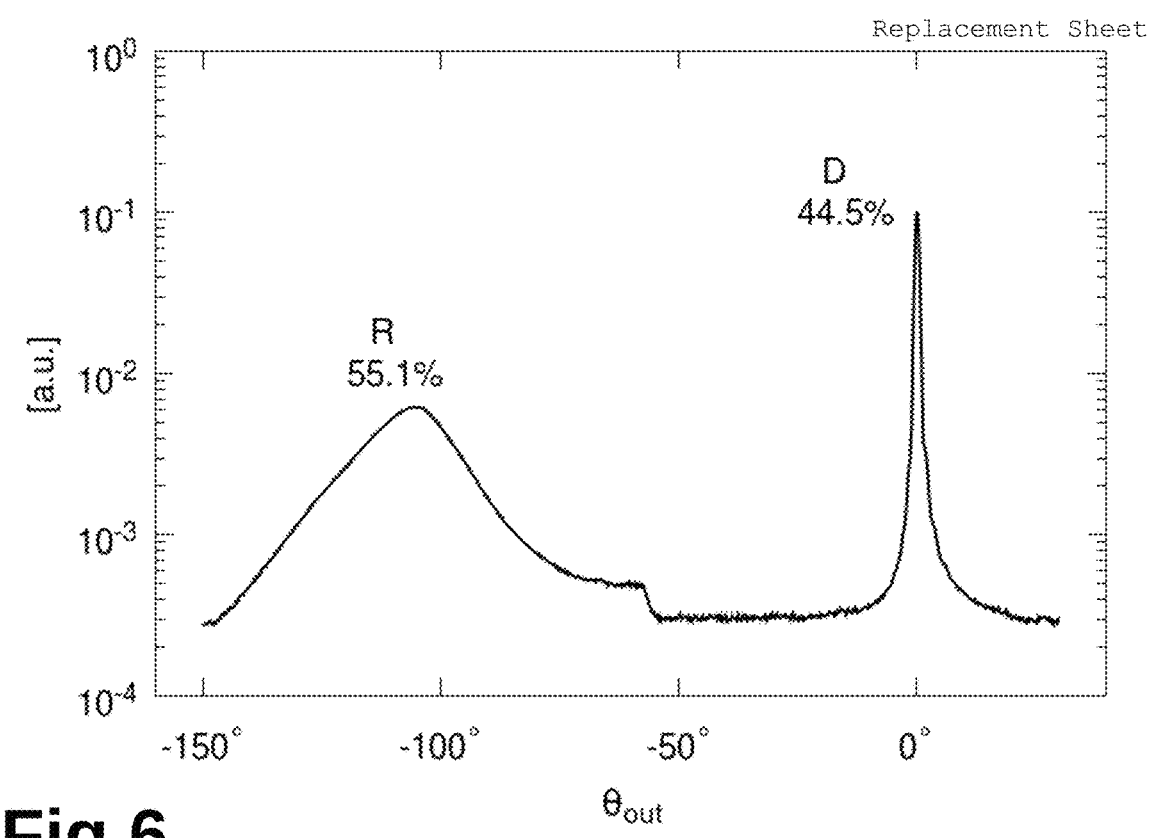
FIG. 6 is a chart showing optical measurements of samples of an embodiment of a pane.

The produced samples were characterized by optical measurements to prove the concept. The measurements showed that the incident electromagnetic radiation is effectively redirected from its path and the transmission decreases for higher angles. Such a measurement is show in FIG. 6 with the outgoing angle $\theta_{out}$ relative to the incoming angle $\theta_i$. For a 60° incoming beam on a sample with integrated flat mirrors, 55.1% of transmitted electromagnetic radiation is redirected upwards R and 44.5% is transmitted in the direction of the beam D. The main limit so far with the samples is the quality of the surface: the roughness makes the redirected electromagnetic radiation very diffuse.

The invention claimed is:

1. Glazing for daylighting and seasonal thermal control, said glazing including a pane defined between an outside-oriented interface and an inside-oriented interface, the pane comprising:
   a first component; fixedly embedded within the pane; and
   a second component fixedly attached to the pane,
   wherein the first component includes a parabolic reflective surface with a focus point located on the second component, and
   wherein the pane is formed of a solid material.

2. Glazing according to claim 1 wherein the second component is made of a material which absorbs electromagnetic radiation.

3. Glazing according to claim 2 wherein the second component is adapted to convert the radiation to at least one of thermal and electrical energy.

4. Glazing according to claim 1 wherein the second component is made of a material which reflects electromagnetic radiation.

5. Glazing according to claim 4 wherein the second component partly reflects electromagnetic radiation.

6. Glazing according to claim 4 wherein the second component reflects at least one of an infrared and ultraviolet radiation but transmits visible light.

7. Glazing according to claim 1 wherein the second component is flat.

8. Glazing according to claim 1 wherein the second component is arranged at the inside-oriented interface.

9. Glazing according to claim 1 wherein the first and second components are arranged to both reflect a sun electromagnetic radiation in summer when an incoming angle of the sun electromagnetic radiation is relatively high.

10. Glazing according to claim 9 wherein the components are arranged to minimize the reflection on the second components in winter, when the incoming angle is relatively low.

11. Glazing according to claim 1 comprising several first and second components.

12. Glazing according to claim 1, wherein the second component reflects incoming electromagnetic radiation.

13. Glazing according to claim 1, wherein the first component has a reflective upper and lower surface.

14. Glazing according to claim 1, wherein the focus point of the parabolic reflective surface is located on the second component for a predetermined range of incoming angles of electromagnetic radiation, the incoming angles defined by an angle between a direction of the incoming electromagnetic radiation and a normal to the outside-oriented interface.

15. Glazing according to claim 14, wherein the predetermined range of incoming angles of incident electromagnetic radiation is between 50° and 70°.

16. Glazing according to claim 1, wherein a curvature of the parabolic reflective surface is based on a distance between the parabolic reflective surface and the focus point.

17. Glazing according to claim 16, wherein a strength of the curvature of the parabolic reflective surface is directly proportional to the distance between the parabolic reflective surface and the focus point.

* * * * *